(12) United States Patent
Oberst et al.

(10) Patent No.: US 11,450,631 B2
(45) Date of Patent: Sep. 20, 2022

(54) ALTERNATIVE INTEGRATION FOR REDISTRIBUTION LAYER PROCESS

(71) Applicant: Lam Research Corporation, Fremont, CA (US)

(72) Inventors: Justin Oberst, Beaverton, OR (US); Bryan L. Buckalew, Tualatin, OR (US); Stephen J. Banik, Happy Valley, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/263,503

(22) PCT Filed: Jul. 26, 2019

(86) PCT No.: PCT/US2019/043729
§ 371 (c)(1),
(2) Date: Jan. 26, 2021

(87) PCT Pub. No.: WO2020/023907
PCT Pub. Date: Jan. 30, 2020

(65) Prior Publication Data
US 2021/0193514 A1    Jun. 24, 2021

Related U.S. Application Data

(60) Provisional application No. 62/703,762, filed on Jul. 26, 2018.

(51) Int. Cl.
*H01L 23/00* (2006.01)
(52) U.S. Cl.
CPC .... *H01L 24/03* (2013.01); *H01L 2224/02335* (2013.01); *H01L 2224/03003* (2013.01);
(Continued)

(58) Field of Classification Search
CPC . H01L 2224/02335; H01L 2224/03003; H01L 2224/03466; H01L 2224/03001;
(Continued)

(56) References Cited

U.S. PATENT DOCUMENTS 10,103,107 B1* 10/2018 Lu .......................... H01L 24/03
2008/0113504 A1  5/2008 Lee
(Continued)

FOREIGN PATENT DOCUMENTS

CN      112514050       3/2021

OTHER PUBLICATIONS

International Application Serial No. PCT/US2019/043729, International Search Report dated Dec. 19, 2019, 5 pgs.
(Continued)

*Primary Examiner* — Daniel Luke
(74) *Attorney, Agent, or Firm* — Schwegman Lundberg & Woessner, P.A.

(57) ABSTRACT

In one example, a method for redistribution layer (RDL) process is described. A substrate is provided. A dielectric layer is deposited on top of the substrate. The dielectric layer is patterned. A barrier and copper seed layer are deposited on top of the dielectric layer. A photoresist layer is applied on top of the barrier and copper seed layer. The photoresist layer is patterned to correspond with the dielectric layer pattern. Copper is electrodepositing in the patterned regions exposed by the photoresist layer. The photoresist layer is removed. The copper and seed barrier are etched.

9 Claims, 12 Drawing Sheets

(52) U.S. Cl.
CPC .......... *H01L 2224/03466* (2013.01); *H01L 2224/03614* (2013.01); *H01L 2224/03912* (2013.01); *H01L 2224/11462* (2013.01); *H01L 2224/11912* (2013.01)

(58) Field of Classification Search
CPC . H01L 2224/03614; H01L 2224/03912; H01L 2224/11462; H01L 2224/11912
See application file for complete search history.

(56) References Cited

U.S. PATENT DOCUMENTS

| | | | | |
|---|---|---|---|---|
| 2014/0124914 | A1* | 5/2014 | Lin | H01L 21/28 257/712 |
| 2014/0302669 | A1* | 10/2014 | Kuo | H01L 24/13 438/614 |
| 2015/0037971 | A1* | 2/2015 | Arvin | H01L 24/11 438/614 |
| 2015/0126030 | A1 | 5/2015 | Yang et al. | |
| 2015/0348843 | A1 | 12/2015 | Kosenko et al. | |
| 2016/0181196 | A1 | 6/2016 | Lee et al. | |
| 2016/0211235 | A1* | 7/2016 | Chen | H01L 24/06 |
| 2017/0179055 | A1* | 6/2017 | Lin | H01L 23/53238 |
| 2017/0243839 | A1 | 8/2017 | Buckalew et al. | |
| 2018/0033756 | A1* | 2/2018 | Lee | H01L 24/03 |
| 2018/0166284 | A1* | 6/2018 | Kim | C25D 17/001 |

OTHER PUBLICATIONS

International Application Serial No. PCT/US2019/043729, Written Opinion dated Dec. 19, 2019, 5 pgs.

"International Application Serial No. PCT US2019 043729, International Preliminary Report on Patentability dated Feb. 4, 2021", 7 pages.

* cited by examiner

ALTERNATIVE INTEGRATION FOR REDISTRIBUTION LAYER PROCESS

RELATED APPLICATION

The present application is a U.S. National Stage Filing under 35 U.S.C. 371 from International Application No. PCT/US2019/043729, filed on Jul. 26, 2019, and published as WO 2020/023907 A1 on Jan. 30, 2020, which claims priority from U.S. Provisional Patent Application No. 62/703,762, filed. Jul. 26, 2018, each of which is herein incorporated by reference in its entirety.

FIELD

The present disclosure relates generally to a redistribution layer (RDL) process, and in particular to systems and methods for alternative integration for RDL.

BACKGROUND

In a conventional RDL process flow, both a thin barrier and copper seed layer are deposited onto an incoming substrate (most often silicon). A photoresist layer is applied, via spin coating or lamination. The photoresist is exposed, developed, and descummed to expose the copper seed in an RDL pattern. This patterned area is then filled with copper via an electroplating process. After electroplating, the photoresist is then removed. To electrically isolate the electroplated RDL patterns, the copper seed and barrier layer are removed last. During the seed removal step (via wet chemical etch), the etchant attacks the copper seed at the pattern/seed interface producing undercut beneath the RDL pattern. Undercut can reduce the mechanical integrity of the RDL pattern and produce poor signal integrity. There are two types of undercut that can occur: (1) seed underneath the RDL pattern is etched and (2) both seed and base of electroplated RDL are etched. As RDL dimensions continue to shrink, this issue is becoming more prominent as the undercut occurs under a larger area of the RDL.

The present disclosure seeks to address these drawbacks. It should be noted that the information described in this section is provided to provide the skilled artisan some context for the following disclosed subject matter and should not be considered as admitted prior art.

DESCRIPTION OF THE DRAWINGS

Some embodiments are illustrated by way of example and not limitation in the views of the accompanying drawings.

FIGS. 5A-5G are block diagrams illustrating a fully embedded alternative integration RDL process, according to an example embodiment.

DESCRIPTION

The description that follows includes systems, methods, techniques, instruction sequences, and computing machine program products that embody illustrative embodiments of the present inventive subject matter. In the following description, for purposes of explanation, numerous specific details are set forth in order to provide a thorough understanding of example embodiments. It will be evident, however, to one skilled in the art, that the present embodiments may be practiced without these specific details.

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings that form a part of this document: Copyright LAM Research Corporation, 2018, All Rights Reserved.

In the present disclosure, various terms are used to describe a semiconductor processing surface: "wafer" and "substrate" may be used interchangeably. The process of depositing, or plating, metal onto a conductive surface of the wafer via an electrochemical reaction may be referred to generally as "electrodeposition" or "electroplating."

Figure 1A:
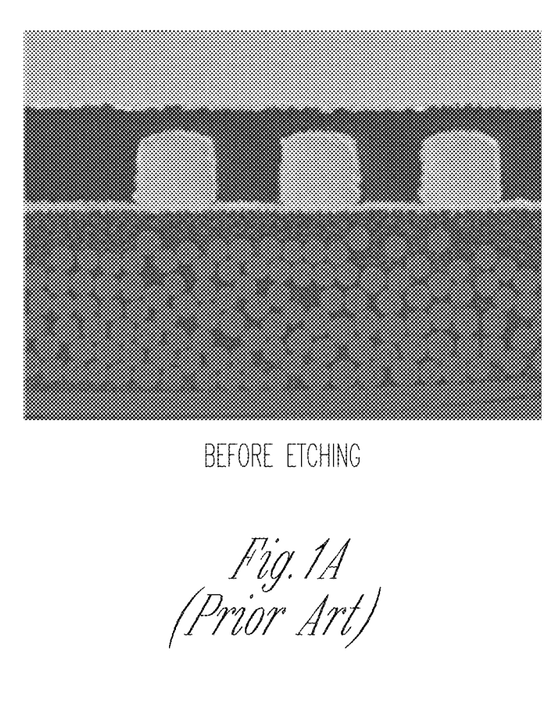
FIG. 1A is a picture of a cross section of a substrate before a conventional redistribution layer (RDL) process.
Figure 1B:
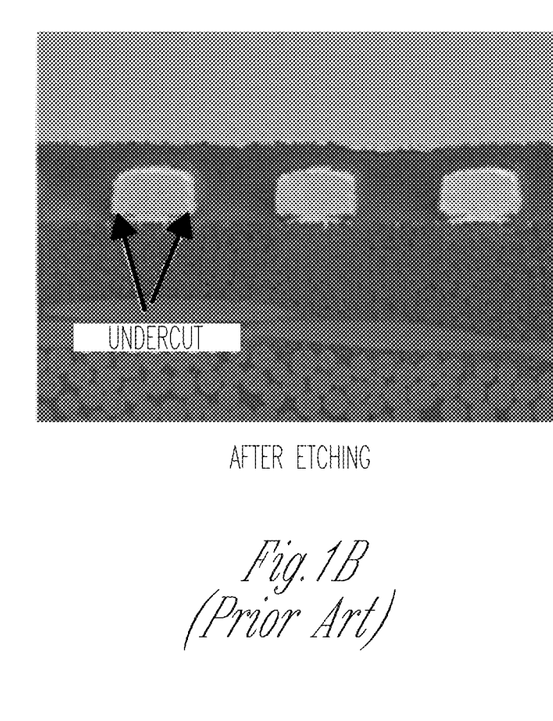
FIG. 1B is a picture of a cross section of a substrate after a conventional RDL process.

The present document describes several alternatives to the conventional redistribution layer (RDL) process: three integration schemes and one electroplating process that result in minimized undercut during seed etch. FIG. 1A is a picture of a cross section of a substrate before a convention RDL process. FIG. 1B is a picture of a cross section of a substrate after a convention RDL process. The after picture illustrates the undercut problem.

Figure 2:
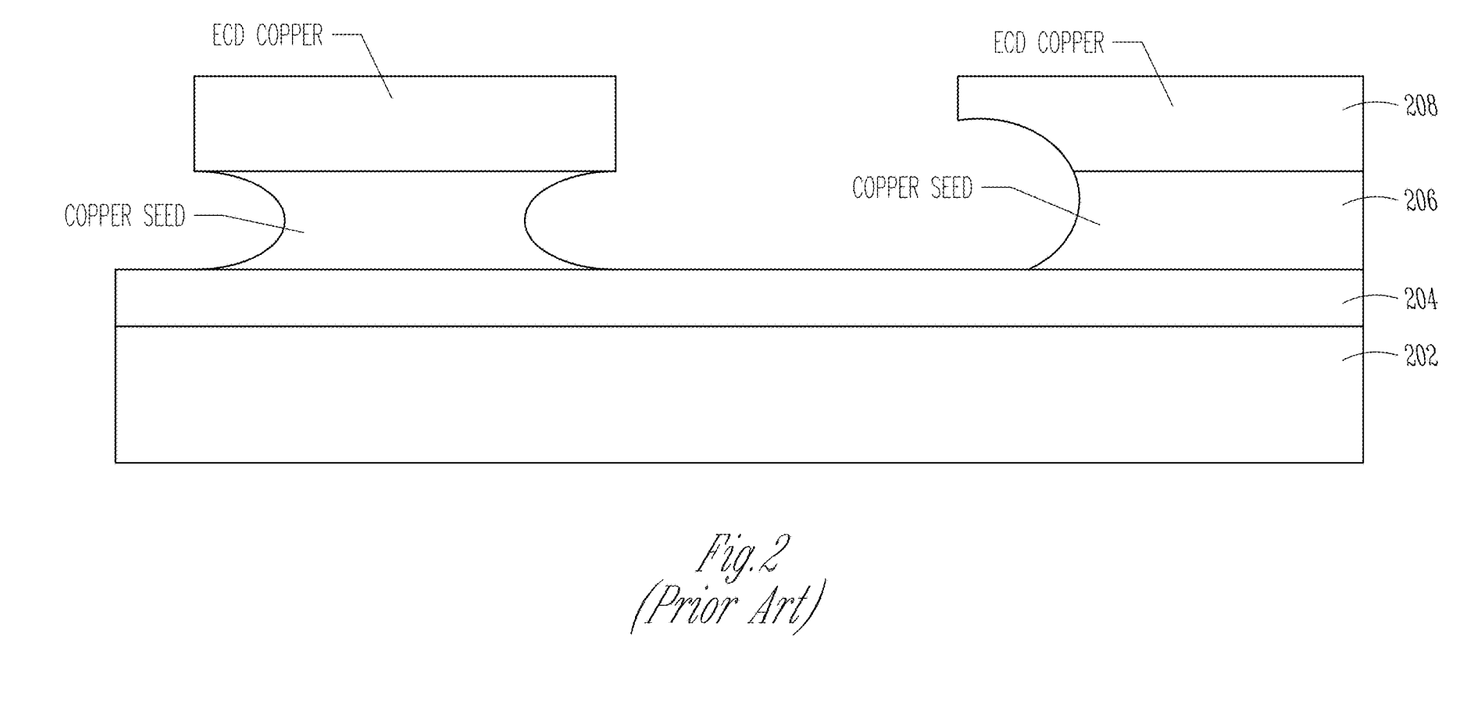
FIG. 2 is a block diagram of a cross section of a substrate after a conventional RDL process.
Figures 3A, 3B:
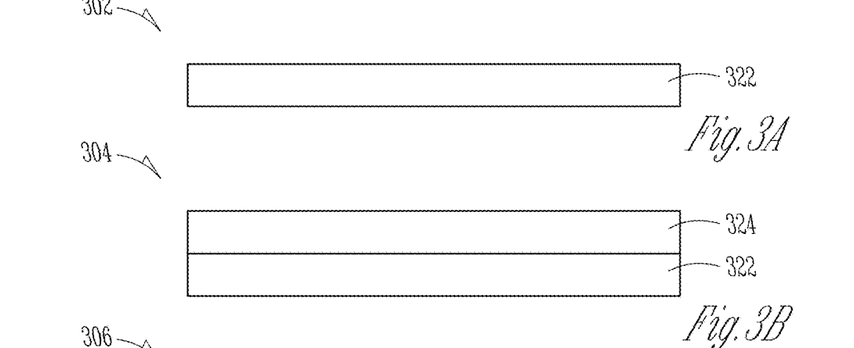
FIGS. 3A-3J are block diagrams illustrating a partially embedded alternative integration RDL process, according to a first example embodiment.
Figure 3C:
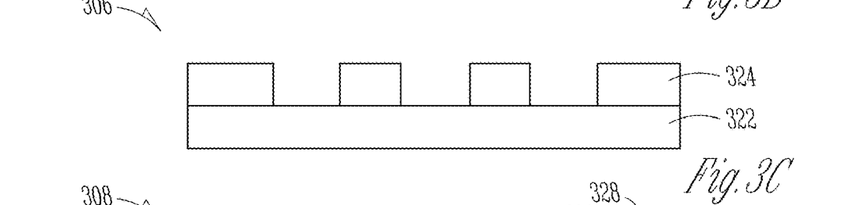
Figure 3D:
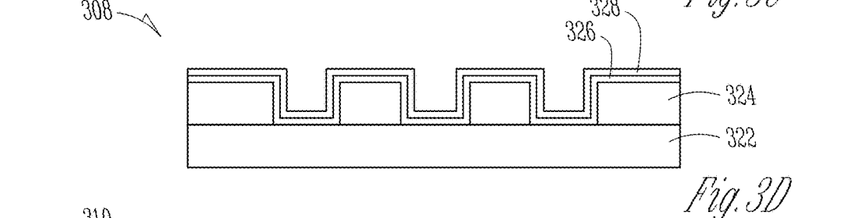
Figure 3E:
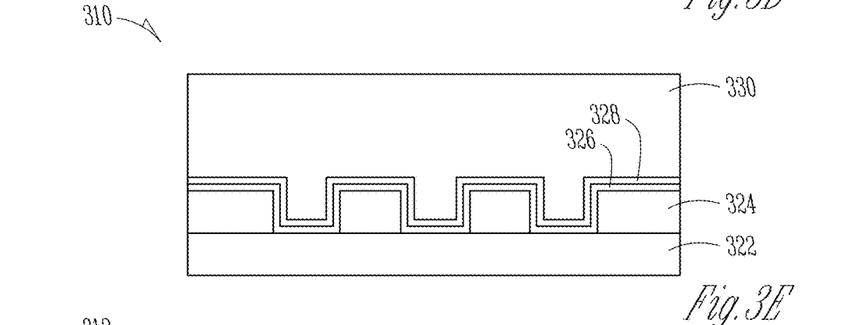
Figure 3F:
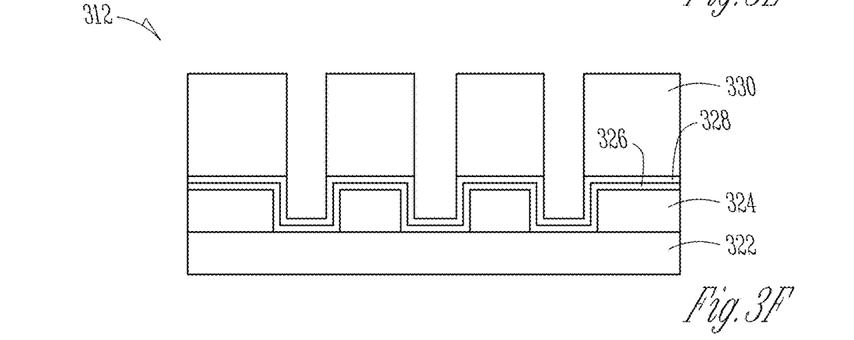
Figure 3G:
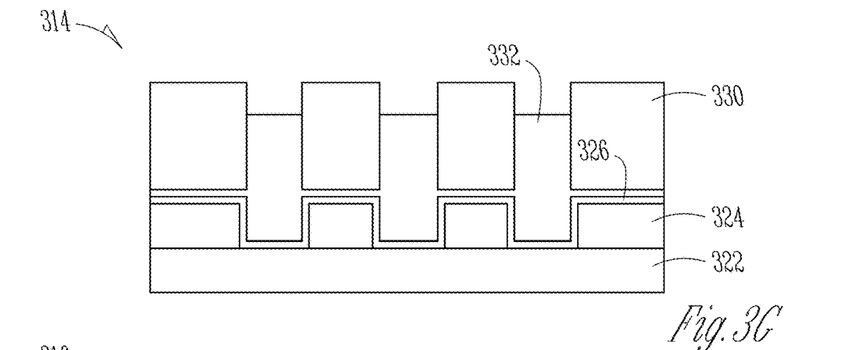
Figure 3H:
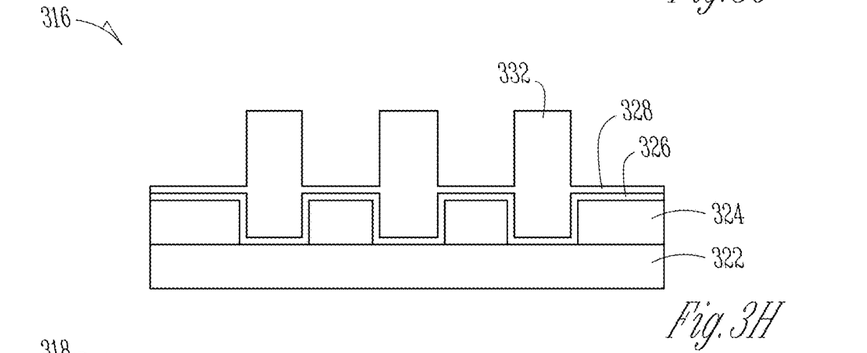
Figure 3I:
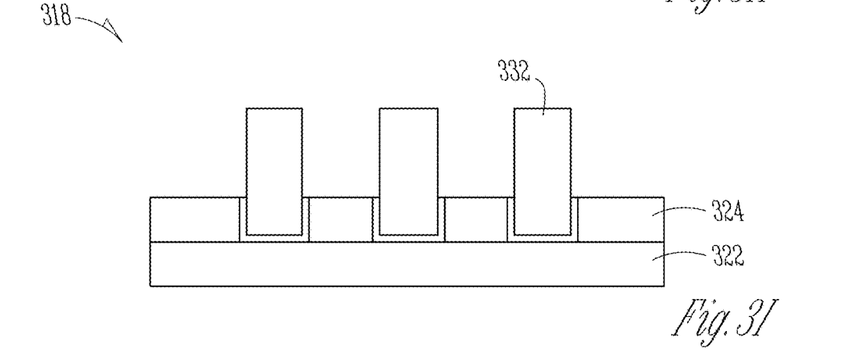
Figure 3J:
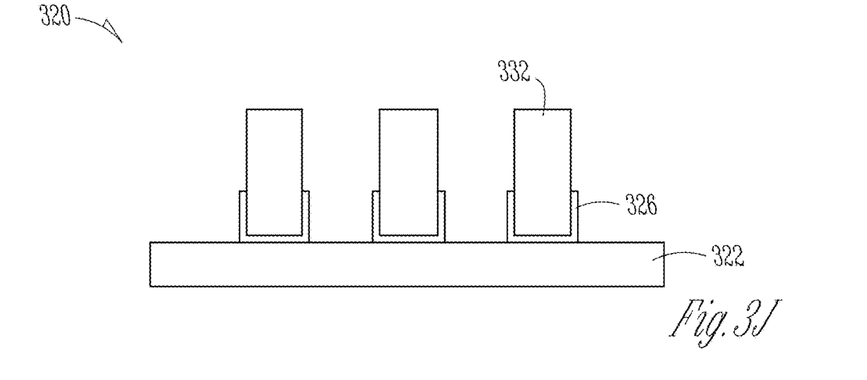

FIG. 2 is a block diagram of a cross section of a substrate after an RDL process. The substrate 202 is deposited with a barrier 204, a copper seed 206, and ECD copper 208. In the first issue type, the copper seed 206 underneath the ECD copper 208 is etched resulting in an undercut. In the second issue type, both the copper seed 206 and the base of electroplated RDL (ECD copper 208) are etched.

FIGS. 3A-3J are block diagrams illustrating a partially embedded alternative integration RDL process, according to a first example embodiment. In this process flow, a substrate 322 is provided at operation 302 in FIG. 3A. At operation 304 in FIG. 3B, a dielectric (polyimide, nitride, etc.) layer 324 is applied to the incoming substrate 322. At operation 306 in FIG. 3C, the dielectric layer 324 is patterned. For photosensitive polymeric material (polyimide), this would require exposure, develop, and descum steps. At operation 308 in FIG. 3D, a barrier layer 326 and a copper seed layer 328 are applied on top of this layer dielectric layer 324. A photoresist layer 330 may be applied to the substrate 322 at operation 310 in FIG. 3E. Depending on the photoresist material (spin on vs. laminate), the photoresist layer 330 could fill the underlying features or just lay atop. The photoresist layer 330 is then exposed, developed, and descummed at operation 312 in FIG. 3E. In this process flow, the patterned feature size matches that in the underlying dielectric as illustrated in operation 312 in FIG. 3F. At operation 314 in FIG. 3G, a copper layer 322 is electroplated in the patterned regions. At operation 316 in FIG. 3H, the photoresist layer 330 is removed. At operation 318 in FIG. 3I, the copper seed layer 328 and the barrier layer 326 is etched and removed. At operation 320 in FIG. 3J, optionally, the dielectric layer 324 can be removed as well. In this integration scheme, the seed etch does not create an undercut. A seed etch may only remove a small amount of material in the electroplated RDL side. It may remove the seed between the RDL structure and the barrier.

Electroplated RDL thickness can range from 2 μm to 10 μm. For partially embedded, the dielectric layer has at least about 0.5 μm minimum thickness. The thickness range may be between 5-50% depending on the RDL final thickness.

FIGS. 4A-4J are block diagrams illustrating a partially embedded alternative integration RDL process, according to a second example embodiment. The flow of FIGS. 4A-4J differs from the flow of FIGS. 3A-3J for RDL dimensions in the photoresist layer. At operation 402 of FIG. 4A, a substrate 422 is provided. At operation 404 of FIG. 4B, a dielectric layer 424 is deposited onto the substrate 422. At operation 406 of FIG. 4C, the dielectric layer 424 is patterned (for polymers: expose, develop, descum). At operation 408 of FIG. 4D, both a barrier layer 426 and a seed layer 428 are deposited on the dielectric layer 424 and the substrate 422.

Figures 4A, 4B, 4C:
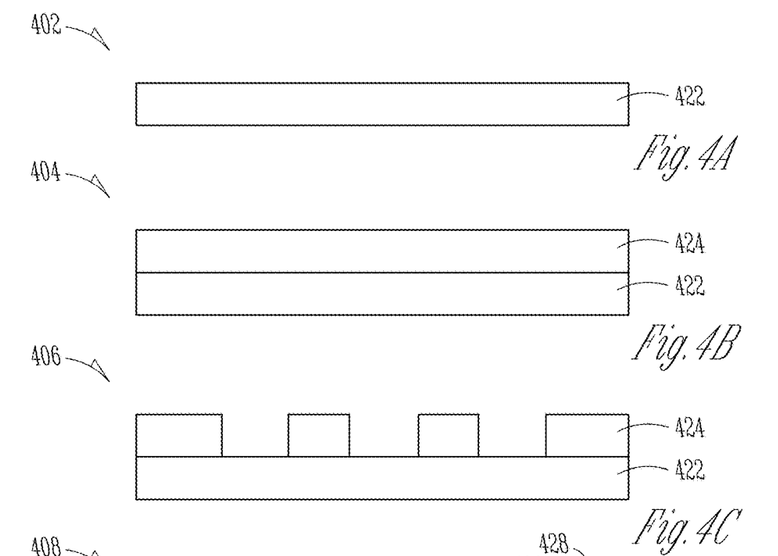
FIGS. 4A-4J are block diagrams illustrating a partially embedded alternative integration RDL process, according to a second example embodiment.
Figure 4D:
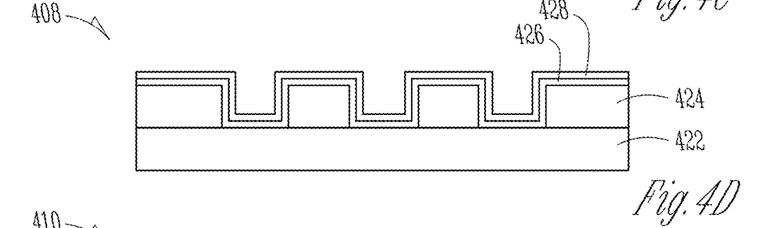
Figure 4E:
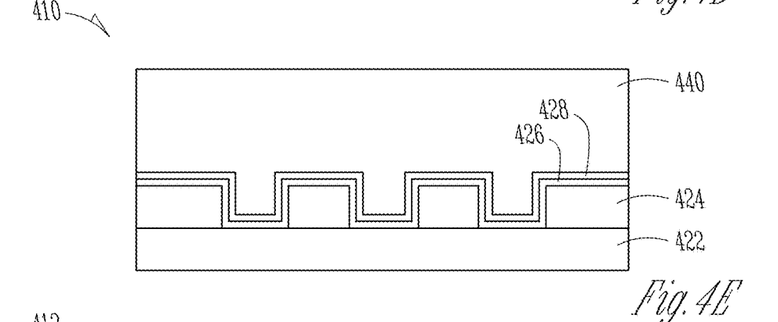
Figure 4F:
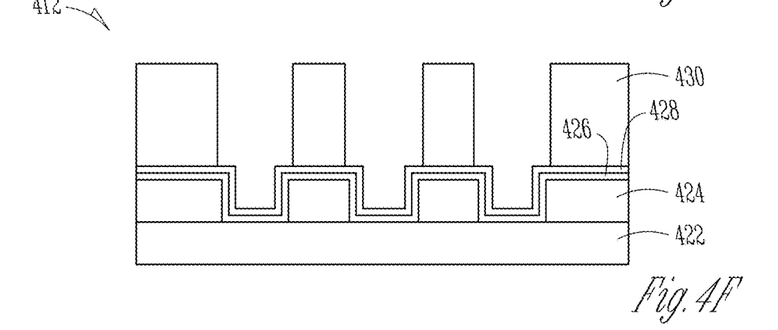
Figure 4G:
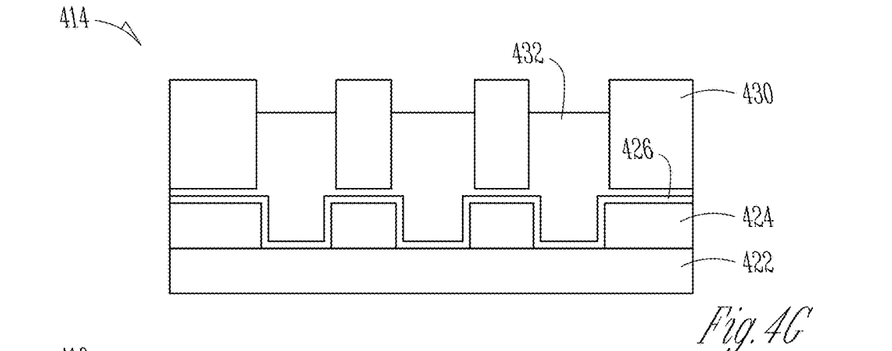
Figure 4H:
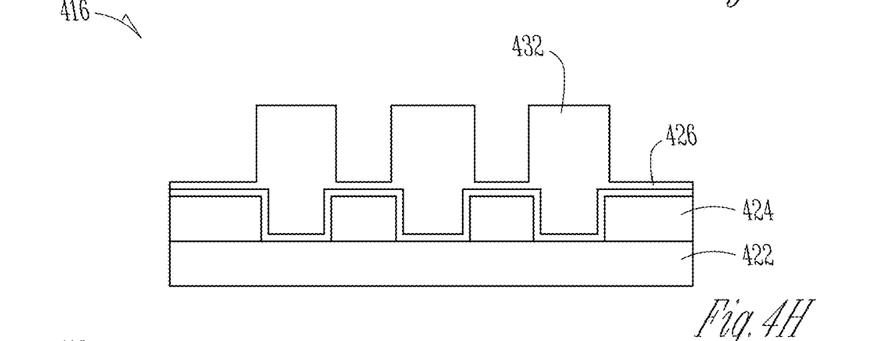
Figure 4I:
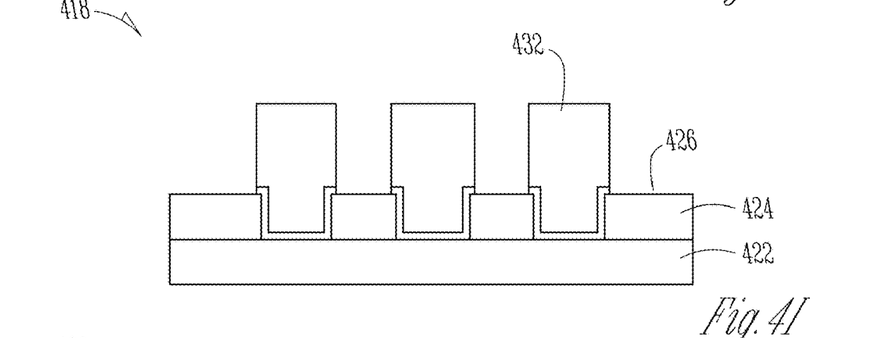
Figure 4J:
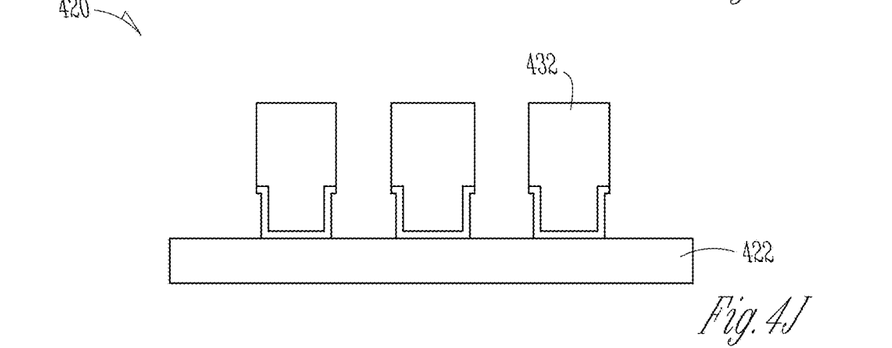
Figure 5A:
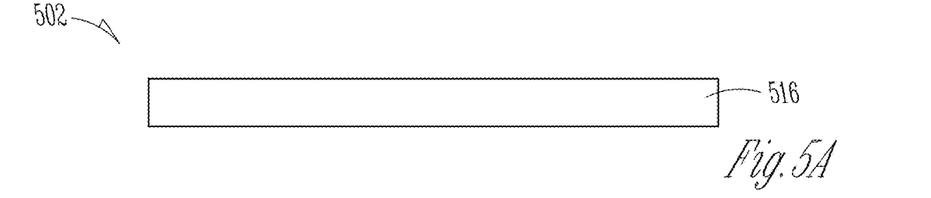
Figure 5B:
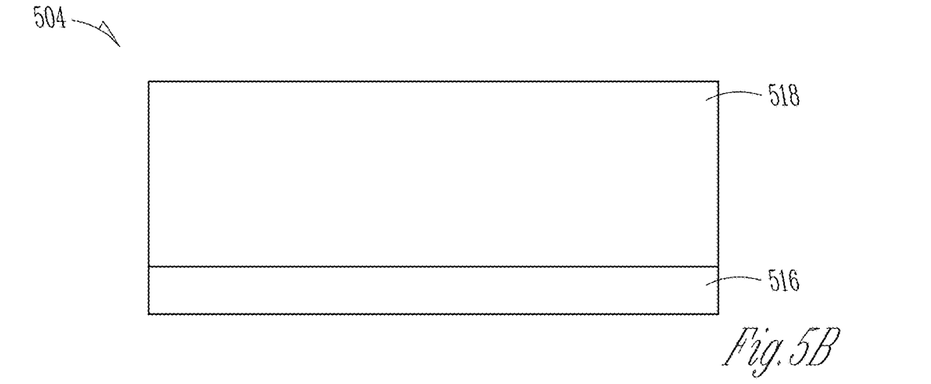
Figure 5C:
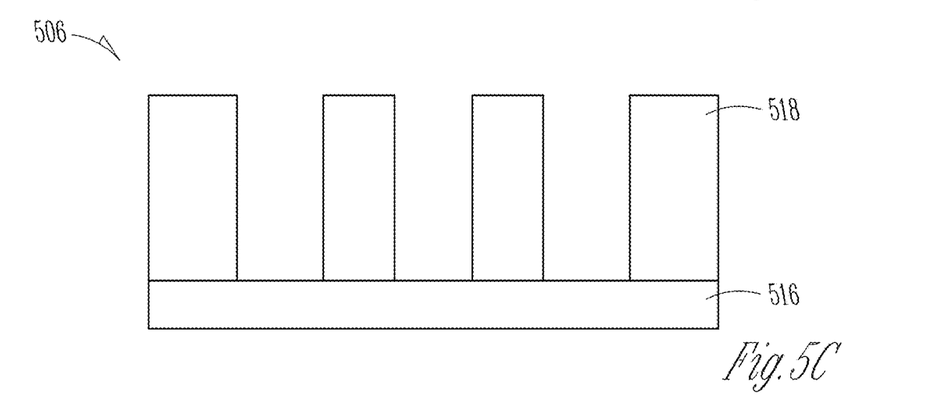
Figure 5D:
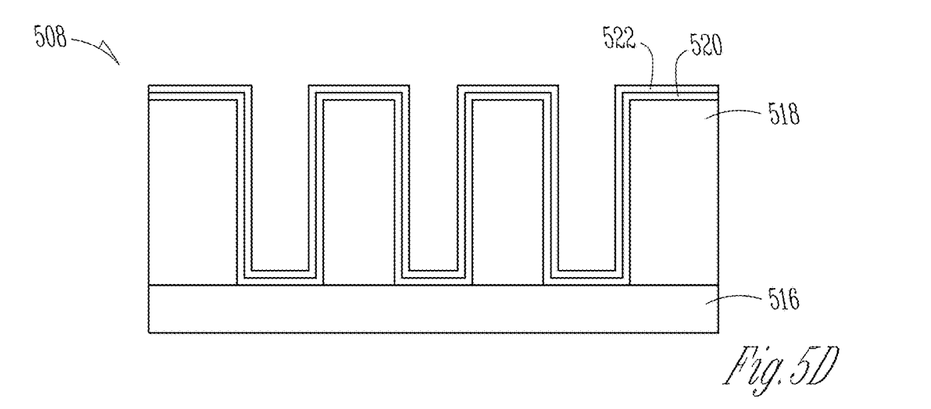
Figure 5E:
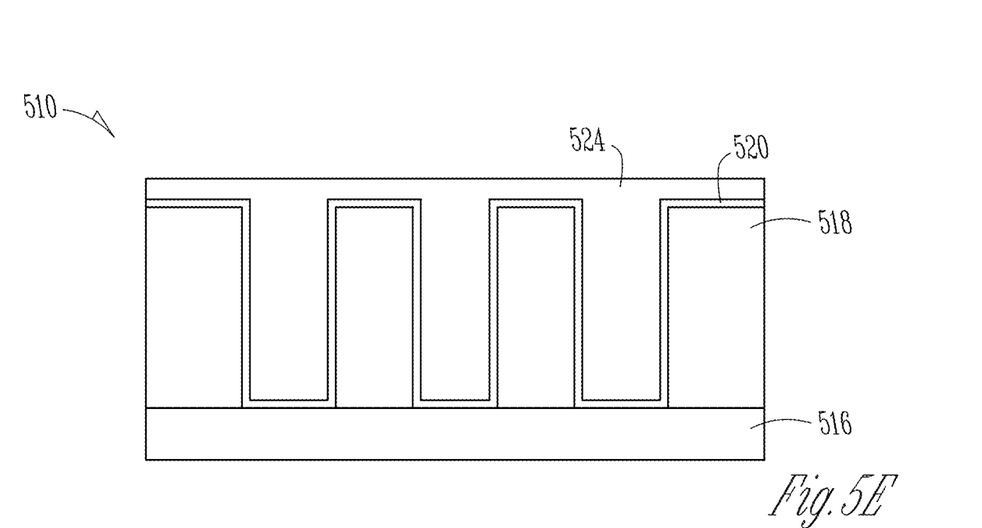
Figure 5F:
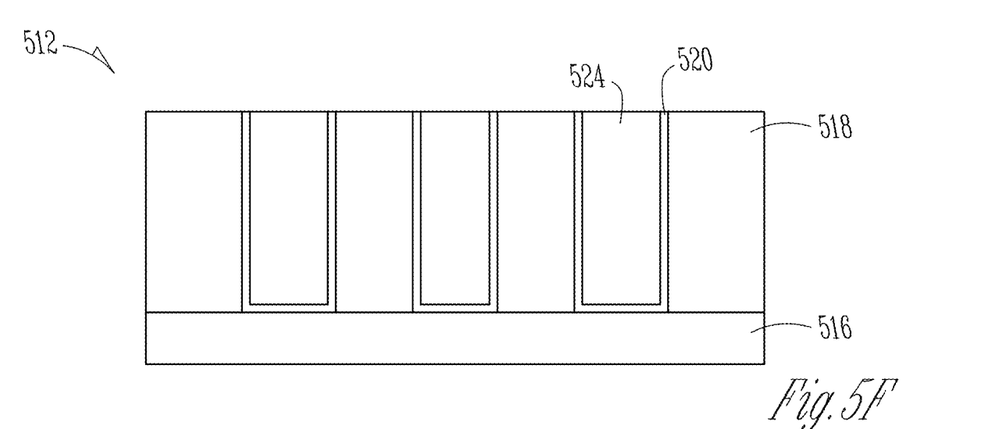

At operation 410 of FIG. 4E, a photoresist layer 430 is applied to the substrate 422. At operation 412 of FIG. 4F, the photoresist layer 430 is patterned similarly to the dielectric layer 424. However, the features in the photoresist layer 430 have larger critical dimensions (CDs) or widths than the corresponding ones in the dielectric layer 424. At operation 414 of FIG. 4G, copper 432 is electrodeposited. At operation 416 of FIG. 4H, the photoresist 430 is removed. At operation 418 of FIG. 4I, the copper seed 426 and the barrier layer 424 are etched. At operation 420 of FIG. 4J, the dielectric layer 424 is optionally removed.

This flow process results in RDL patterns with thicker dimensions near the top. This can be beneficial to maintain RDL dimensions post-copper seed etch. This flow may also minimize side-wall cut in after seed etch resulting in RDL structures of excellent mechanical integrity.

FIGS. 5A-5G are block diagrams illustrating a fully embedded alternative integration RDL process, according to an example embodiment. In this process flow, a substrate 516 is provided at operation 502 of FIG. 5A. At operation 504 of FIG. 5B, a dielectric (polyimide, nitride, etc.) layer 518 is applied to the incoming substrate 516. At operation 506 of FIG. 5C, the dielectric layer 518 is patterned. For photosensitive polymeric material (polyimide), this process includes exposure, develop, and descum steps. At operation 508 of FIG. 5D, a barrier layer 520 and a copper seed layer 522 are applied on top of the patterned dielectric layer 518 and exposed surface of the substrate 516. At operation 510 of FIG. 5E, copper 524 is electroplated in the patterned regions. At operation 512 of FIG. 5F, the copper 524 is planarized. The plating evolution is illustrated by operation 514 in FIG. 5G.

Figure 6A:
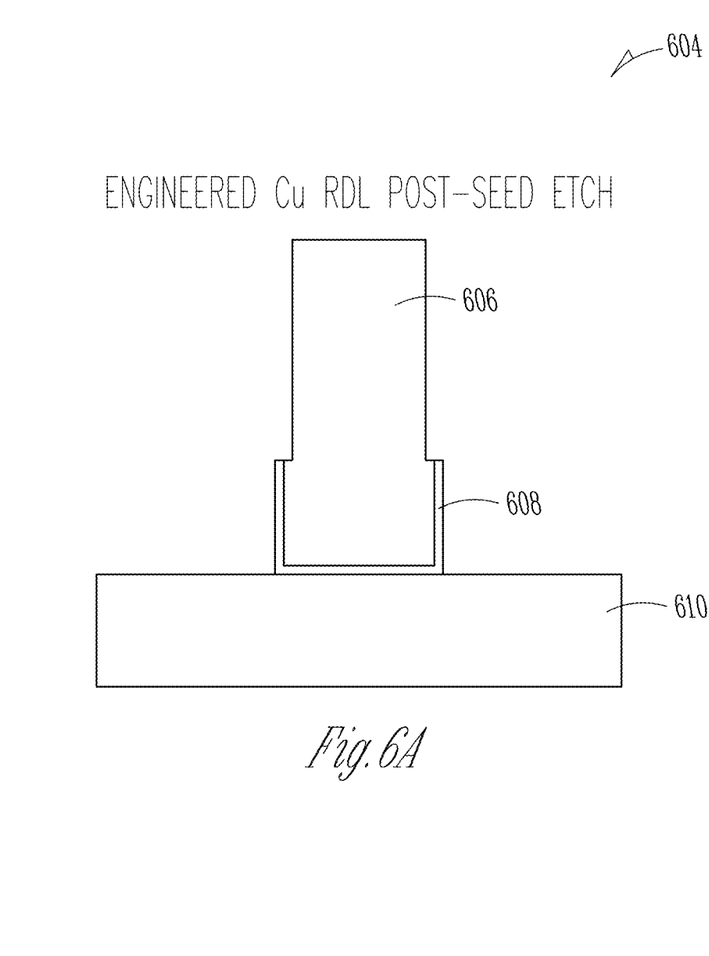
FIG. 6A is cross-sectional depiction of a substrate illustrating an example of engineered copper RDL post-seed etch.

FIG. 6A is a cross-sectional depiction of a substrate illustrating an example of grain engineering. Cross-section 604 illustrates a substrate 610, a barrier 608, and a copper layer 606. To minimize seed etch effect, a stronger, more robust electroplated copper may be required. This can be engineered using various process parameters including waveform, convection, and chemistry.

Figure 6B:
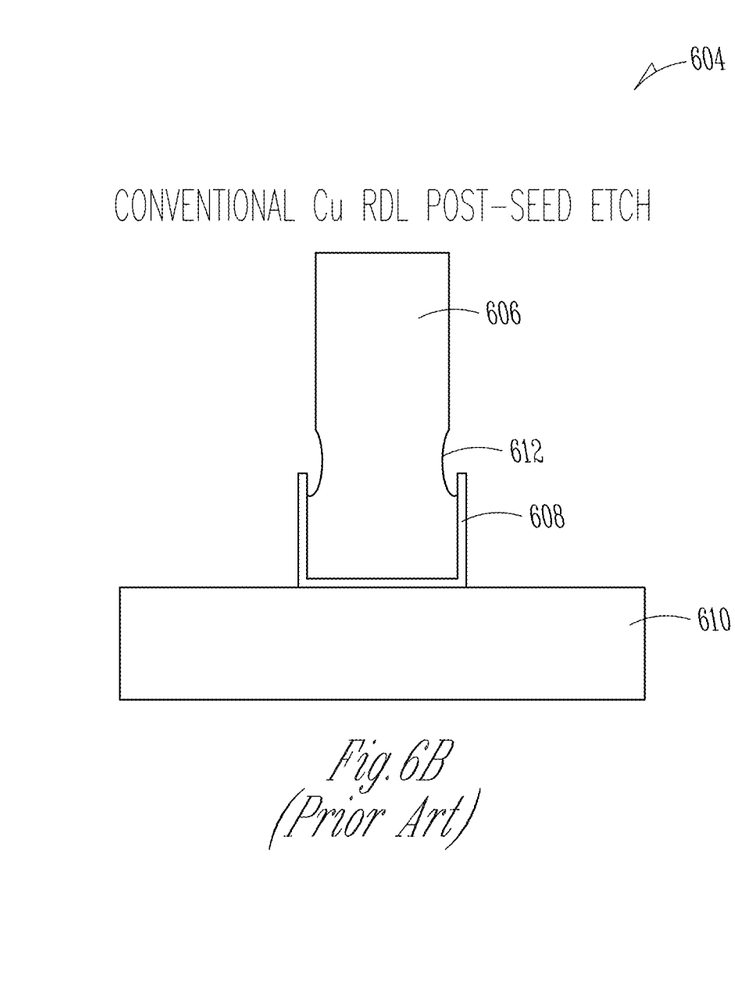
FIG. 6B is cross-sectional depiction of a substrate illustrating a conventional copper RDL post-seed etch.

Some copper grain structures that can be engineered to exhibit etch resistance include large grains, columnar grains, and nanotwinned grains. As an example, nanotwinned copper has previously been shown to have high tensile strength, excellent electrical conductivity, and high electromigration resistance. If formed early in the electroplating process, the engineered grain structure (including nanotwins) could reduce the attack on the electroplated copper although not reducing the undercut to the copper seed layer beneath the RDL structure. In the above alternative process schemes detailed above, grain engineered copper could minimize etch into the side of the electroplated RDL structure. This would maintain the pattern dimensions and mechanical integrity of the RDL FIG. 6B is a cross-sectional depiction of a substrate illustrating an example of a conventional copper RDL post-seed etch. Cross-section 604 illustrates an undercut 612 in the copper 606 in a conventional copper RDL post-seed etch.

Figure 7:
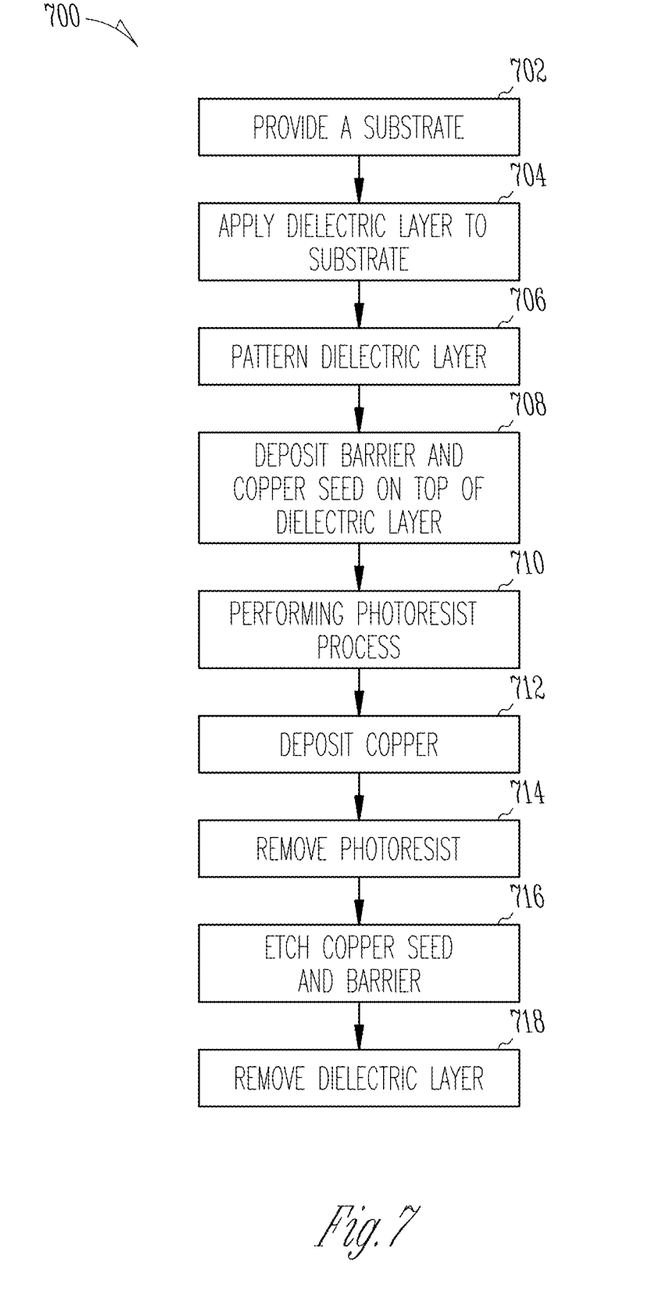
FIG. 7 is flow diagram illustrating a method for a partially embedded RDL process, according to an example embodiment.

FIG. 7 is flow diagram illustrating a method for a partially embedded RDL process, according to an example embodiment. At operation 702, a substrate is provided. At operation 704, a dielectric (polyimide, nitride, etc.) is applied to the substrate. At operation 706, the dielectric layer is patterned. For photosensitive polymeric material (polyimide), this would require exposure, develop, and descum steps. At operation 708, a barrier and copper seed layer is applied on top of the layer dielectric layer. At operation 710, a photoresist process is applied to the substrate. The photoresist is exposed, developed, and descummed at operation 710. In this process flow, the patterned feature size would match that in the underlying dielectric. At operation 712, copper is electroplated in the patterned regions. At operation 714, the photoresist is removed. At operation 716, the copper seed and barrier etch is removed. At operation 718, optionally, the dielectric layer can be removed as well. In this integration scheme, the seed etch does not create an undercut.

Figure 8:
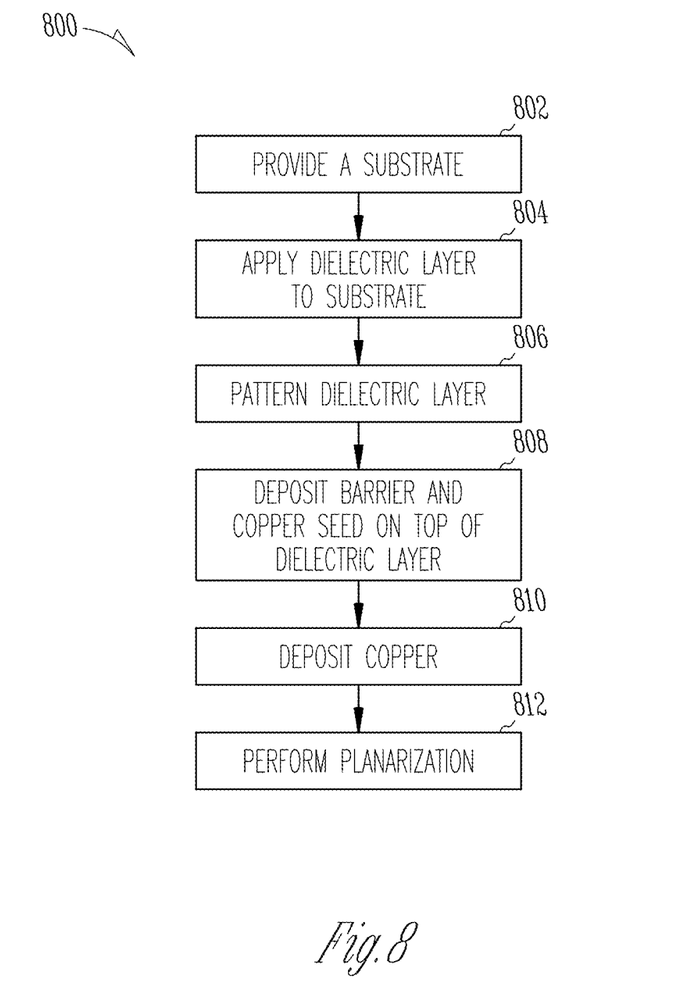
FIG. 8 is flow diagram illustrating a method for a fully embedded RDL process, according to an example embodiment.

FIG. 8 is flow diagram illustrating a method for a fully embedded RDL process, according to an example embodiment. At operation 802, a substrate is provided. At operation 804, a dielectric (polyimide, nitride, etc.) is applied to the substrate. At operation 806, the dielectric layer is patterned. For photosensitive polymeric material (polyimide), this would require exposure, develop, and descum steps. At operation 808, a barrier and copper seed layer is deposited on top of this layer dielectric layer. At operation 810, copper is electroplated in the patterned regions. At operation 812, the copper (or copper/dielectric layer) is planarized.

Although an embodiment has been described with reference to specific example embodiments, it will be evident that various modifications and changes may be made to these embodiments without departing from the scope of the disclosure. Accordingly, the specification and drawings are to be regarded in an illustrative rather than a restrictive sense. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled. Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover all adaptations or variations of various embodiments. Combinations of the above embodiments, and other embodiments not specifically described herein, will be apparent to those of skill in the art upon reviewing the above description.

EXAMPLES

Example 1 is a method for redistribution layer (RDL) process, the method comprising: depositing a dielectric layer on a surface of a substrate; patterning the dielectric layer, the patterned dielectric layer exposing a region of the surface of the substrate; depositing a protective layer on the patterned dielectric layer and the exposed region of the surface of the substrate; depositing a photoresist layer on the protective layer; patterning the photoresist layer, the patterned photoresist layer exposing a first region of the protective layer; electrodepositing a copper layer on top of the exposed first region of the protective layer; removing the patterned photoresist layer to expose a second region of the protective layer; and removing the exposed second region of the protective layer to expose the patterned dielectric layer.

Example 2 includes the method of example 1, further comprising: removing the exposed patterned dielectric layer to expose a region of the surface of the substrate.

Example 3 includes the method of example 2, wherein a size of a feature in the patterned photoresist layer is larger than a size of a feature in the patterned dielectric layer.

Example 4 includes the method of example 1, wherein a size of a feature in the patterned photoresist layer is smaller than a size of a feature in the patterned dielectric layer.

Example 5 includes the method of example 1, wherein the protective layer comprises a barrier layer and a copper seed layer, the copper seed layer being on top of the barrier layer.

Example 6 includes the method of example 1, wherein the dielectric layer comprises a photosensitive polyimide layer or a nitride layer.

Example 7 includes the method of example 6, wherein patterning the dielectric layer further comprises: forming the patterned dielectric layer using expose, develop, and descum processes.

Example 8 includes the method of example 1, wherein a feature size of the patterned photoresist layer matches a feature size of the underlying patterned dielectric layer.

Example 9 includes the method of example 1, wherein depositing the photoresist layer on top of the protective layer further comprises: filling features of the patterned dielectric layer with the photoresist layer.

Example 10 includes the method of example 1, wherein the photoresist layer lays on top of the features of the patterned dielectric layer and does not fill the features of the patterned dielectric layer.

What is claimed is:

1. A method for redistribution layer (RDL) process, the method comprising:
    depositing a dielectric layer on a surface of a substrate;
    patterning the dielectric layer, the patterned dielectric layer exposing a region of the surface of the substrate;
    depositing a protective layer on the patterned dielectric layer and the exposed region of the surface of the substrate;
    depositing a photoresist layer on the protective layer;
    patterning the photoresist layer, the patterned photoresist layer exposing a first region of the protective layer;
    electrodepositing a copper layer on top of the exposed first region of the protective layer;
    removing the patterned photoresist layer to expose a second region of the protective layer;
    removing the exposed second region of the protective layer to expose the patterned dielectric layer; and
    exposing a region of the surface of the substrate and a barrier layer of the protective layer along a bottom of a sidewall of the copper layer, by removing the exposed patterned dielectric layer.

2. The method of claim 1, wherein a size of a feature in the patterned photoresist layer is larger than a size of a feature in the patterned dielectric layer.

3. The method of claim 1, wherein a size of a feature in the patterned photoresist layer is smaller than a size of a feature in the patterned dielectric layer.

4. The method of claim 1, wherein the protective layer comprises the barrier layer and a copper seed layer, the copper seed layer being on top of the barrier layer.

5. The method of claim 1, wherein the dielectric layer comprises a photosensitive polyimide layer or a nitride layer.

6. The method of claim 5, wherein patterning the dielectric layer further comprises:
    forming the patterned dielectric layer using expose, develop, and descum processes.

7. The method of claim 1, wherein a feature size of the patterned photoresist layer matches a feature size of the underlying patterned dielectric layer.

8. The method of claim 1, wherein depositing the photoresist layer on top of the protective layer further comprises: filling features of the patterned dielectric layer with the photoresist layer.

9. The method of claim 1, wherein the photoresist layer lays on top of the features of the patterned dielectric layer and does not fill the features of the patterned dielectric layer.

* * * * *